United States Patent
Apfelbacher et al.

(10) Patent No.: US 7,515,421 B2
(45) Date of Patent: Apr. 7, 2009

(54) ELECTRONIC DEVICE COMPRISING SECURE HEAT DISSIPATION

(75) Inventors: Walter Apfelbacher, Freihung (DE); Thomas Kurbjuweit, Amberg (DE); Annemarie Lehmeier, Ursensollen (DE); Norbert Reichenbach, Amberg (DE)

(73) Assignee: Siemens Aktiengesellschaft, Munich (DE)

( * ) Notice: Subject to any disclaimer, the term of this patent is extended or adjusted under 35 U.S.C. 154(b) by 320 days.

(21) Appl. No.: 10/546,997

(22) PCT Filed: Feb. 17, 2004

(86) PCT No.: PCT/EP2004/001494

§ 371 (c)(1),
(2), (4) Date: Aug. 26, 2005

(87) PCT Pub. No.: WO2004/077908

PCT Pub. Date: Sep. 10, 2004

(65) Prior Publication Data

US 2006/0164810 A1 Jul. 27, 2006

(30) Foreign Application Priority Data

Feb. 28, 2003 (EP) .................................. 03004554

(51) Int. Cl.
*H05K 7/20* (2006.01)
(52) U.S. Cl. .................. 361/709; 361/688; 361/707; 361/714
(58) Field of Classification Search ............ 361/688, 361/707, 714, 709
See application file for complete search history.

(56) References Cited

U.S. PATENT DOCUMENTS

| | | | | | |
|---|---|---|---|---|---|
| 3,961,666 | A | * | 6/1976 | Suzuki et al. | 165/129 |
| 4,039,900 | A | * | 8/1977 | Roback et al. | 361/709 |
| 4,047,242 | A | * | 9/1977 | Jakob et al. | 361/714 |
| 4,821,051 | A | * | 4/1989 | Hediger | 347/130 |
| 5,003,429 | A | * | 3/1991 | Baker et al. | 361/704 |
| 5,065,280 | A | * | 11/1991 | Karnezos et al. | 361/715 |
| 5,132,874 | A | * | 7/1992 | Chandler et al. | 361/722 |
| 5,138,521 | A | * | 8/1992 | Watanabe et al. | 361/703 |
| 5,175,613 | A | * | 12/1992 | Barker et al. | 257/713 |
| 5,280,191 | A | * | 1/1994 | Chang | 257/712 |

(Continued)

FOREIGN PATENT DOCUMENTS

JP           8222671           8/1996

(Continued)

OTHER PUBLICATIONS

Office Action for Japanese Patent Application No. 2006-501869 dated Nov. 22, 2007 (in English).

*Primary Examiner*—Anatoly Vortman
(74) *Attorney, Agent, or Firm*—Harness, Dickey & Pierce

(57) ABSTRACT

A multi-component housing including a housing shell and a housing lid is disclosed. A support plate that is fitted with at least one power electronics component is disposed on a base plate of the housing shell. The housing lid supports a mounting device for fastening the housing to a cooling body by pressing the support plate to a supporting area of the cooling body. At least one supporting element is provided for transferring a pressing force that is applied in the direction of the base plate from the housing lid to the housing shell.

26 Claims, 2 Drawing Sheets

U.S. PATENT DOCUMENTS

| | | | |
|---|---|---|---|
| 5,305,185 A * | 4/1994 | Samarov et al. | 361/704 |
| 5,313,097 A * | 5/1994 | Haj-Ali-Ahmadi et al. | 257/706 |
| 5,402,313 A * | 3/1995 | Casperson et al. | 361/710 |
| 5,424,919 A * | 6/1995 | Hielbronner | 361/710 |
| 5,426,565 A * | 6/1995 | Anderson | 361/711 |
| 5,473,510 A * | 12/1995 | Dozier, II | 361/719 |
| 5,673,172 A * | 9/1997 | Hastings et al. | 361/685 |
| 5,787,576 A | 8/1998 | Warren et al. | |
| 5,835,350 A * | 11/1998 | Stevens | 361/704 |
| 5,880,930 A | 3/1999 | Wheaton | |
| 5,907,474 A * | 5/1999 | Dolbear | 361/705 |
| 6,043,981 A * | 3/2000 | Markow et al. | 361/704 |
| 6,065,530 A * | 5/2000 | Austin et al. | 165/80.3 |
| 6,147,867 A * | 11/2000 | Gaudrel et al. | 361/707 |
| 6,272,015 B1 * | 8/2001 | Mangtani | 361/707 |
| 6,549,409 B1 * | 4/2003 | Saxelby et al. | 361/704 |
| 6,870,738 B2 * | 3/2005 | Goebl | 361/719 |
| 6,936,919 B2 * | 8/2005 | Chuang et al. | 257/717 |

FOREIGN PATENT DOCUMENTS

| | | |
|---|---|---|
| JP | 2000269671 | 9/2000 |
| JP | 2003031978 | 1/2003 |

* cited by examiner

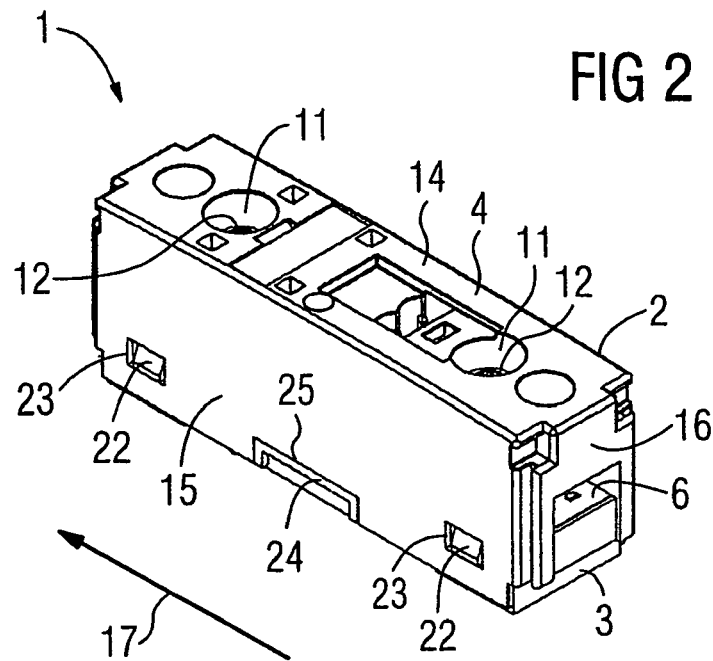
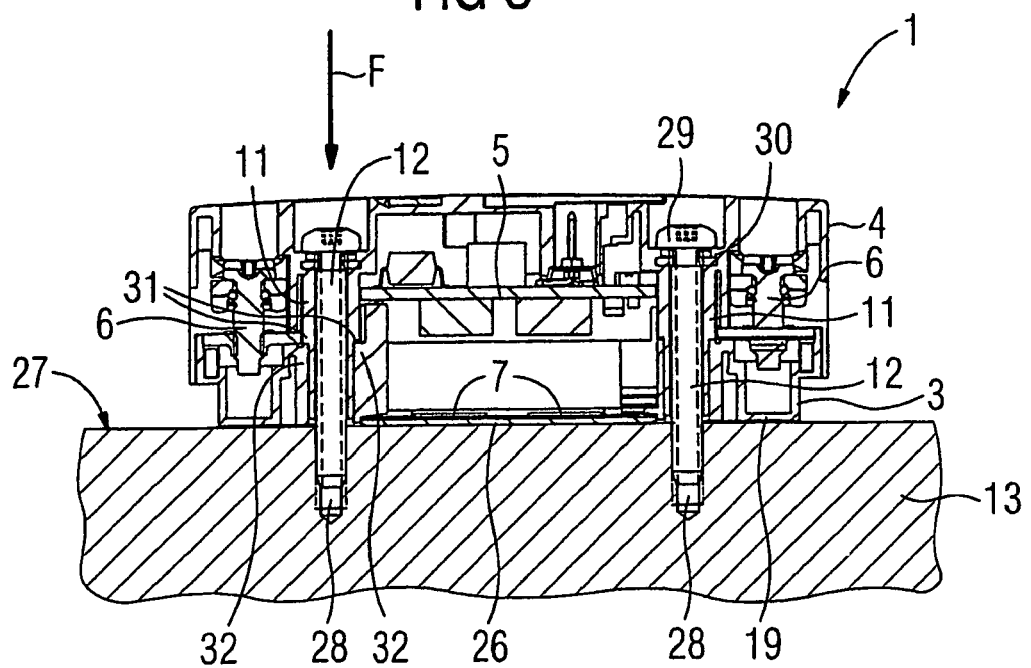

ELECTRONIC DEVICE COMPRISING SECURE HEAT DISSIPATION

This application is the national phase under 35 U.S.C. § 371 of PCT International Application No. PCT/EP2004/001494 which has an International filing date of Feb. 17, 2004, which designated the United States of America and which claims priority on European Patent Application number EP 03004554.6 filed Feb. 28, 2003, the entire contents of which are hereby incorporated herein by reference.

FIELD

The invention generally relates to an electronic appliance, e.g. an electronic switching device.

BACKGROUND

An electronic device normally contains an electronic circuit which is provided with one or more electronic power components, for example a MOSFET, a power diode or the like. Such a power component also generates considerable heat loss in intended use, the heat loss needing to be dissipated from the appliance's housing in order to avoid overheating the circuit.

To create good dissipation of the heat loss, it is usual to mount the device on a, in particular, metal heat sink. Good heat transfer from the device to this heat sink is achieved by virtue of a carrier plate fitted with the power component(s) being integrated directly into the appliance's housing.

In this context, the carrier plate is expediently provided in a housing baseplate which, in the mounted state, bears directly against a bearing face of the heat sink. Especially since the thermal connection between the carrier plate and the heat sink is all the better the greater the evenness with which and the larger the area over which the carrier plate rests on the heat sink, the device is usually screwed to the heat sink, as a result of which the carrier plate is pressed against the bearing face of the heat sink.

To produce this screw joint, clips are frequently attached to the appliance's housing which protrude beyond said housing, particularly in the housing's longitudinal direction. The design of these clips means that they are at a relatively great distance from the center of gravity of the carrier plate. Thus, the fixing points at which the device is screwed to the heat sink are also at a relatively great distance from the carrier plate, as a result of which the prestress produced by the screw joint is transferred to the carrier plate only unfavorably and with a high level of loss.

The unfavorable energy transmission path results in high torsional loading on the housing, which arises to an increased degree particularly at the junction between the clips and the housing and in the area surrounding the edges of the carrier plate. These material stresses mean that the housing and/or the carrier plate can become damaged and—in the most unfavorable case—can even break.

To overcome the material distortions, the carrier plate has to date been soldered flat to a metal mounting plate then in turn screwed to the heat sink. However, soldering the carrier plate onto the mounting plate disadvantageously requires an additional and time-consuming production step. Furthermore, the mounting plate is a supplementary part of the device which firstly increases the manufacturing costs for the device and secondly increases the appliance's physical volume.

SUMMARY

At least one embodiment of the invention includes an object of specifying an electronic device in which safe heat dissipation is made possible while lessening or even avoiding at least one of the aforementioned drawbacks.

The housing of the device is of multipart design and includes a housing shell and a housing cover which is put onto the housing shell in the manner of a shoebox. In this context, the housing shell has a baseplate which is provided for contact with a heat sink and into which a carrier plate fitted with at least one electronic power component is inserted. The housing cover in turn is provided with a mounting device for fixing the housing to a heat sink and hence for pressing the carrier plate against a bearing face of the heat sink. The contact pressure produced by the mounting device is in this context transferred from the housing cover to the housing shell by at least one support element.

The multipart, particularly for example two-part, housing design gives the housing a degree of flexibility which distributes asymmetrical material deformations roughly evenly within over the housing. In other words, with locally appearing material deformation, the particularly two housing parts can work against one another, so that overloading of local housing regions is avoided. This results particularly in any contact pressure exerted on the device being dissipated particularly evenly onto the baseplate, which ensures that the carrier plate integrated in the base area is in areal contact with the bearing face of the heat sink.

The at least one support element can be used for particularly specific transfer of the contact pressure to the housing shell. As set out in more detail below, a plurality of support elements are preferably provided which are arranged symmetrically around the carrier plate and as close as possible to the carrier plate. This achieves particularly good, even and hence material-saving contact between the carrier plate and the heat sink.

The housing cover and the housing shell are preferably latched to one another. The two housing parts are thus held captively against one another both in the mounted and in the unmounted state. On the other hand, the latch connection does not suppress the advantageous flexibility of the housing design.

In one expedient embodiment, the mounting device includes at least two fixing screws, each of which is guided and supported in an associated screw guide in the housing cover. To make the fixing points at which the device is fixed on the heat sink as close as possible to the carrier plate in order to improve the energy transfer path, each screw guide is routed through the housing interior. This design is particularly especially favorable in respect of the torsional loading which acts on the housing in the mounted state. The screw guide is additionally used for electrically insulating the fixing screws from the housing interior.

One or more support elements are advantageously arranged in the region of the side walls of the housing. In this context, the two housing walls oriented in the housing's longitudinal direction, which are angled off from the baseplate, are denoted as the side walls of the housing. These side walls flank the transverse sides of the carrier plate, that is to say are oriented in the longitudinal direction of the carrier plate. The side walls are therefore arranged comparatively close to the center of gravity of the carrier plate, which allows comparatively central transfer of energy to the carrier plate.

The two-part construction of the housing means that the two housing parts, that is to say the housing cover and the housing shell, overlap in the region of the side walls. Each side wall of the housing thus includes a side wall of the housing cover and an associated side wall of the housing shell adjoining one another in layered fashion. Preferably, the or each support element associated with a side wall of the housing comprises a support projection which is integrally formed on a first housing part and which engages on a corresponding support contour in the side wall of the second housing part.

The first housing part, carrying the support projection, which is chosen is preferably the housing shell, while the housing cover carries the support contour as a second housing part. However, it is equivalently also possible to fit the support projection on the housing cover and to provide a support contour on the housing shell. Preferably, a respective support element is also provided in approximately longitudinally centered fashion relative to each side wall. In addition, it is also possible for a plurality of support elements to be arranged for each side wall, however.

The side walls form the largest planar faces of the housing design. They are therefore naturally comparatively unstable in respect of pressure stresses acting within the housing. To prevent the side walls from buckling under the action of the contact pressure, which could cause the support element(s) arranged in the side wall to slip from their support position, the or each support projection is preferably produced in the style of an undercut.

This is understood to mean that the support edge of each support projection protrudes from the associated side wall at an acute angle and, in the support position, engages behind the adjacent support contour of the second housing part. In this way, the mutually adjacent side walls are pressed against one another all the more the more intense the contact pressure is. The mutually adjacent side walls of the two housing parts thus stabilize one another under the action of the contact pressure. To stiffen the housing further, provision is made for the housing shell and/or the housing cover to be provided with stiffening ribs, particularly in the region of the side walls.

So as to achieve good energy transfer in the region of the end sides of the carrier plate too, one advantageous embodiment has a support element also arranged in the region of the or each screw guide. This support element includes a radial projection protruding from the screw guide, particularly a graduated widening of the screw guide, which radial projection interacts with a corresponding stop on the housing shell, particularly in the form of a hollow cylindrical projection.

To improve the contact between the carrier plate and the heat sink further, provision is also made for the carrier plate to protrude slightly over the baseplate into the housing exterior. For particularly good and even transfer of the contact pressure to the carrier plate, the or each screw guide is arranged in the housing's longitudinal direction directly at or at a slight distance from the carrier plate. In addition, the carrier plate is expediently framed completely by the baseplate in order to transfer the contact pressure evenly from the housing shell to the carrier plate.

BRIEF DESCRIPTION OF THE DRAWINGS

An example embodiment of the invention is explained in more detail below with reference to the drawings, in which:

FIG. 2 shows a perspective view of the device shown in FIG. 1 in the assembled state, and FIG. 3 shows a longitudinal section through the device shown in FIG. 2.

Mutually corresponding parts have been provided with the same reference symbols in all figures.

DETAILED DESCRIPTION OF THE EXAMPLE EMBODIMENTS

Figure 1:
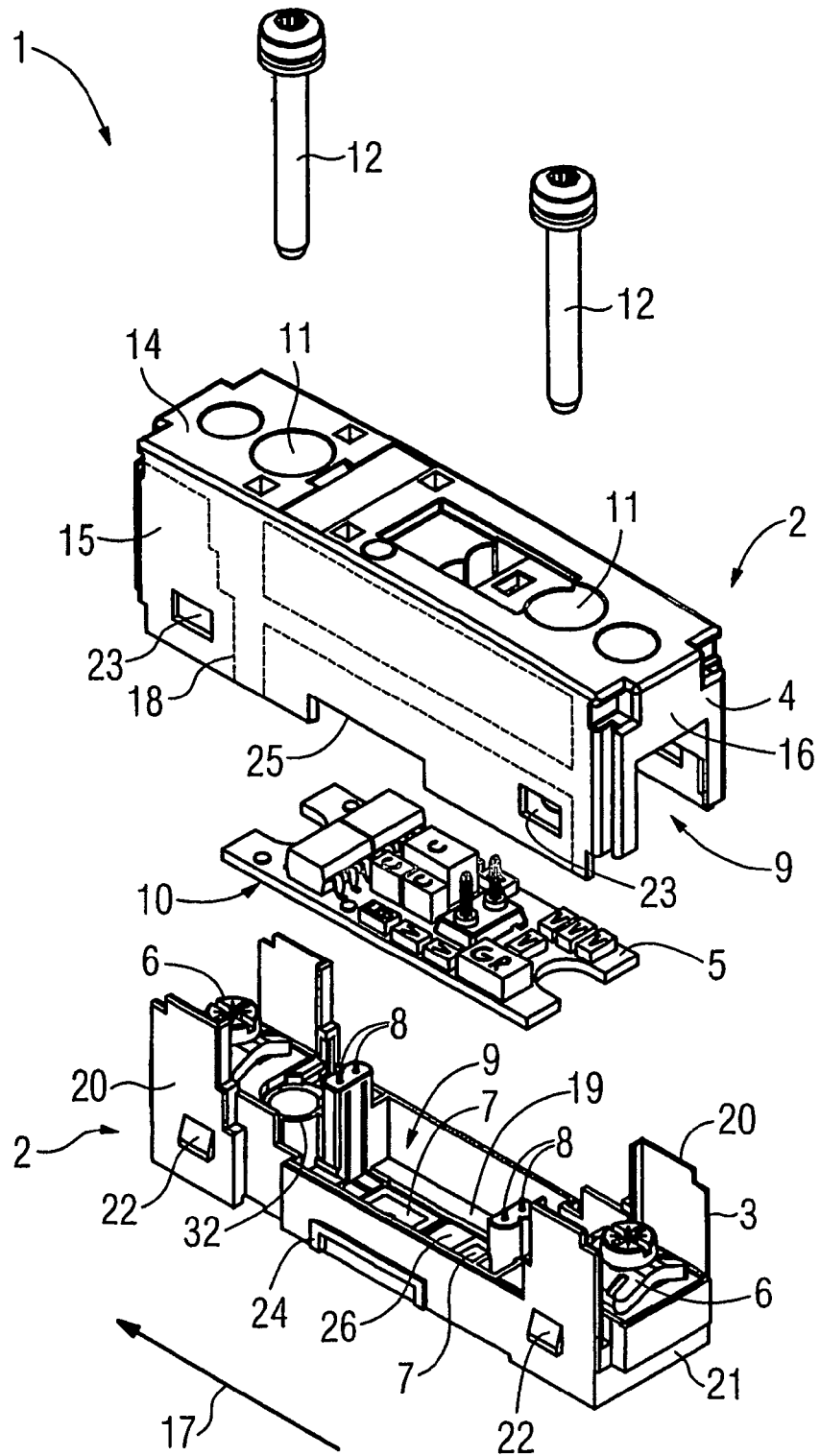
FIG. 1 shows an exploded view of an electronic device with a housing, including a housing shell and a housing cover, and a carrier plate integrated into the housing shell for electronic power components.

The electronic device 1 shown in an exploded view in FIG. 1 is a switching device, for example. The device 1 is provided with an insulating housing 2. The housing 2 is in two parts and comprises a well-like housing shell 3 and a likewise well-like housing cover 4, which can be put onto the housing shell 3 in the manner of a shoebox. The device 1 also includes a printed circuit board 5 which can be inserted into the housing 2, i.e. a plate-like circuit carrier which is fitted with elements of an electronic circuit.

In the assembled state of the device 1, which is shown in FIGS. 2 and 3, the printed circuit board 5 is electrically connected to two contact terminals 6 arranged in the housing shell 3 and to further electronic power components 7, which are likewise arranged in the housing shell 3. The contact between these circuit elements which have been moved away from the printed circuit board 5, i.e. the contact terminals 6 and the power components 7, and the printed circuit board 5 is made by way of pin contacts 8 which project from the housing shell 3 into the housing interior 9 and make contact with the printed circuit board 5 on its underside 10.

The housing cover 4 is provided with two screw guides 11 into which a respective fixing screw 12 is inserted. In simple terms, the screw guides 11 each have approximately the shape of hollow cylindrical projections which project from the housing cover 4 into the housing interior 9 and in the direction of the housing shell 3 and pass through the entire housing interior 9. The fixing screws 12 can thus be pushed through the housing 2 along the screw guides 11 and are used to screw the device 1 to a base, particularly a heat sink 13 (FIG. 3). The fixing screws 12 and the associated screw guides 11 are therefore referred to as a mounting device together.

The housing cover 4 includes a central, approximately rectangular cover face 14 from whose edges two side walls 15 and two end walls 16 are angled off approximately at right angles. In this case, the side walls 15 are oriented in the housing's longitudinal direction 17 while the end walls 16 are oriented at right angles thereto. The side walls 15 and end walls 16 are in turn connected to one another at their adjacent edges, so that the housing cover 4, in simplified terms, has the shape of a hollow parallelepiped which is open at its underside. The housing cover 4 is particularly stable toward pressure loading or torsional loading as a result of this shaping. To stiffen the housing cover 4 further, the side walls 15 are provided with stiffening ribs 18. The stiffening ribs 18 are integrally formed on that side of the side walls 15 which faces the housing interior 9. In the perspective illustration shown in FIG. 1, they are therefore hidden and for this reason are indicated only as dashed lines.

The housing shell 3 has a central baseplate 19 opposite the cover face 14 of the housing cover 4, from which baseplate 19, in a similar manner to the housing cover 4, side walls 20 and end walls 21, deeply cut as a passage for the contact terminals 6, are angled off approximately at right angles.

In the assembled state of the device 1, the printed circuit board 5 has been inserted into the housing 2 (FIG. 3), and the housing shell 3 is latched to the housing cover 4 which has been put on. This is done using latching lugs 22 which are fitted on the housing shell 3 and each of which engages in a receptacle 23 which is made at the appropriate place in the housing cover 4. In the assembled state, a support projection 24 projecting outward from each side wall 20 is also held in form-fitting fashion in a support contour 25 which is cut into each side wall 15. In this case, the support projection 24 is shaped in the style of an undercut, so that it engages behind the side wall 15 in the region of the support contour 25.

The device 1 is particularly in a form such that the heat loss generated by the power components 7 while the device 1 is operating can be dissipated safely from the device 1. To this end, the power components 7 are designed to be on a, in particular, ceramic carrier plate 26 which in turn is integrated nondetachably into the baseplate 19 of the housing shell 3. To this end, the carrier plate 26 is inserted from the outside into a window-like aperture in the baseplate 19 and is preferably bonded to the housing shell 3. The housing shell 3 overlaps the carrier plate 26 in its entire border region, so that the carrier plate 26 is completely framed by the housing shell 3.

If, as FIG. 3 shows, the device 1 is fitted onto the heat sink 13 by the baseplate 19, the carrier plate 26 rests on the bearing face 27 of the heat sink 13. Thus, the heat loss generated in the power components 7 can drain directly into the heat sink 13 via the thin carrier plate 26. The carrier plate 26 and the heat sink 13 optionally have a heat-conducting foil or heat-conducting paste interposed between them, in line with conventional engineering, in order to improve the transfer of heat.

For good thermal contact between the carrier plate 26 and the heat sink 13, it is important for the carrier plate 26 to rest on the bearing face 27 under prestress and over as large an area as possible. In this context, the carrier plate 26 should be pressed against the bearing face 27 as evenly as possible in order to prevent any damaging material deformation. The necessary contact pressure F is generated by screwing the fixing screws 12 into threaded holes 28 made in the heat sink 13 as appropriate.

In this context, the contact pressure F is transferred to the housing cover 4 via a support 30 for the screw guides 11 which corresponds to the screw head 29 of each fixing screw 12. The housing cover 4 transfers the contact pressure F to the housing shell 3 via support elements, which are described in more detail below. The housing shell 3 in turn transfers at least some of the contact pressure F to the carrier plate 26, which is prestressed against the bearing face 27 as a result. Some of the contact pressure F is also transferred to the heat sink 13 via the baseplate 19 of the housing shell 3.

One of the support elements is formed by the support projection 24 and the corresponding support contour 25 (FIG. 2). By way of the support projection 24 and the corresponding support contour 25, the contact pressure F is advantageously transferred via each pair of side walls 15 and 20. This transfer of energy therefore takes place close to the transverse edges of the carrier plate 26 and, in this respect, comparatively close to the center of gravity of the carrier plate 26, which is particularly favorable for the energy transfer path.

A respective additional support element is arranged in the region of each screw guide 11 and includes a radial projection 31, in the form of a graduated expansion, and a corresponding stop 32, which is in the form of a projection of the housing shell 3 (which projection projects into the housing interior 9 in approximately hollow cylindrical form) and which encloses the associated screw guide 11 concentrically. The support elements formed by a respective radial projection 31 and by a corresponding stop 32 are arranged compactly on the carrier plate 26 in the housing's longitudinal direction 17.

The contact pressure F is thus transferred from the housing cover 4 to the housing shell 3, and from there to the carrier plate 26, on all sides and symmetrically with respect to the carrier plate 26, and hence particularly evenly. This avoids material deformations at points, in particular. To be able to transfer as large a portion of the contact pressure F to the carrier plate as possible, the carrier plate 26 protrudes slightly above the baseplate 19. The carrier plate 26 is thus clamped more or less between the baseplate 19 and the bearing face 27.

The advantage of the two-part housing 2 becomes evident particularly if the fixing screws 12 are screwed to the heat sink 13 asymmetrically, i.e. with different levels of prestress. Especially since the two housing halves can work against one another on account of the comparatively flexible latching connection, local stress peaks within the housing material are avoided.

Example embodiments being thus described, it will be obvious that the same may be varied in many ways. Such variations are not to be regarded as a departure from the spirit and scope of the present invention, and all such modifications as would be obvious to one skilled in the art are intended to be included within the scope of the following claims.

The invention claimed is:

1. An electronic device having a multipart housing, comprising:
   a housing shell, a baseplate of the housing shell bearing a carrier plate fitted with at least one electronic power component; and
   a housing cover bearing a mounting device for fixing the housing to a heat sink by pressing the carrier plate against a bearing face of the heat sink, wherein the housing shell and the housing cover are latched to one another.

2. The electronic device as claimed in claim 1, wherein the carrier plate protrudes outward over the baseplate.

3. The electronic device as claimed in claim 1, wherein the baseplate of the housing shell forms a closed frame for the carrier plate.

4. The electronic device as claimed in claim 1, wherein the mounting device includes at least two fixing screws and a respective associated screw guide in the housing cover, each screw guide being routed through the housing interior.

5. The electronic device as claimed in claim 4, wherein the screw guide is arranged in the housing's longitudinal direction directly at or at a slight distance from each longitudinal end of the carrier plate.

6. The electronic device as claimed in claim 4, wherein at least one support element is provided for transferring a contact pressure directed toward the baseplate from the housing cover to the housing shell wherein the support element includes a radial projection of the screw guide in the housing cover, said radial projection interacting with a corresponding stop on the housing shell.

7. The electronic device as claimed in claim 4, wherein at least one of the housing shell and the housing cover are provided with stiffening ribs.

8. The electronic device as claimed in claim 1, wherein at least one of the housing shell and the housing cover are provided with stiffening ribs.

9. The electronic device as claimed in claim 1, wherein the baseplate of the housing shell forms a closed frame for the carrier plate.

10. The electronic device as claimed in claim 1, wherein the carrier plate protrudes outward over the baseplate.

11. The electronic device as claimed in claim 1, wherein at least a portion of the housing cover covers at least a portion of sides of the housing shell when the housing cover and the housing shell are connected.

12. The electronic device as claimed in claim 1, wherein at least one support element is provided for transferring a contact pressure directed toward the baseplate from the housing cover to the housing shell.

13. The electronic device as claimed in claim 12, wherein the support element is arranged on a side wall of the housing.

14. The electronic device as claimed in claim 13, wherein the support element includes a support projection, integrally formed on a side wall of one of the shell and housing cover, which engages on a corresponding support contour in the side wall of the other one of the shell and housing cover.

15. The electronic device as claimed in claim 14, wherein the support projection is produced in the style of an undercut.

16. The electronic device as claimed in claim 1, wherein at least one of the housing shell and the housing cover are provided with stiffening ribs.

17. An electronic device having a multipart housing, comprising:
    a housing shell, a baseplate of the housing shell bearing a carrier plate fitted with at least one electronic power component; and
    a housing cover bearing a mounting device for fixing the housing to a heat sink by pressing the carrier plate against a bearing face of the heat sink, wherein the mounting device includes at least two fixing screws and a respective associated screw guide in the housing cover, each screw guide being routed through the housing interior.

18. The electronic device as claimed in claim 17, wherein at least one of the housing shell and the housing cover are provided with stiffening ribs.

19. The electronic device as claimed in claim 17, wherein at least one support element is provided for transferring a contact pressure directed toward the baseplate from the housing cover to the housing shell and wherein the support element includes a radial projection of the screw guide in the housing cover, said radial projection interacting with a corresponding stop on the housing shell.

20. The electronic device as claimed in claim 17, wherein the screw guide is arranged in the housing's longitudinal direction directly at or at a slight distance from each longitudinal end of the carrier plate.

21. An electronic device having a multipart housing, comprising:
    a housing shell, the housing shell including a carrier plate fitted with at least one electronic power component;
    a housing cover including a mounting device for fixing the housing to a heat sink via pressure of the carrier plate against the heat sink; and
    means for transferring a contact pressure from the housing cover to the housing shell and wherein the means for transferring a contact pressure is arranged on a side wall of the housing.

22. The electronic device as claimed in claim 21, wherein the means for transferring a contact pressure includes at least one support element.

23. An electronic device having a multipart housing, comprising:
    a housing shell, a baseplate of the housing shell bearing a carrier plate fitted with at least one electronic power component; and
    a housing cover bearing a mounting device for fixing the housing to a heat sink by pressing the carrier plate against a bearing face of the heat sink,
    wherein at least one support element is provided for transferring a contact pressure directed toward the baseplate from the housing cover to the housing shell, and
    wherein the support element is arranged on a side wall of the housing.

24. The electronic device as claimed in claim 23, wherein the support element includes a support projection, integrally formed on a side wall of one of the shell and housing cover, which engages on a corresponding support contour in the side wall of the other one of the shell and housing cover.

25. The electronic device as claimed in claim 24, wherein the support projection is produced in the style of an undercut.

26. An electronic device having a multipart housing, comprising:
    a housing shell, the housing shell including a carrier plate fitted with at least one electronic power component; and
    a housing cover including a mounting device for fixing the housing to a heat sink via pressure of the carrier plate against the heat sink, wherein the mounting device includes at least two fixing screws and a respective associated screw guide in the housing cover, each screw guide being routed through the housing interior.

* * * * *